(12) United States Patent
Mousavi et al.

(10) Patent No.: US 10,033,176 B2
(45) Date of Patent: Jul. 24, 2018

(54) FAULT INTERRUPTING DEVICES AND CONTROL METHODS THEREFOR

(75) Inventors: Mirrasoul J. Mousavi, Cary, NC (US); Le Tang, Cary, NC (US)

(73) Assignee: ABB Research Ltd., Zurich (CH)

(*) Notice: Subject to any disclaimer, the term of this patent is extended or adjusted under 35 U.S.C. 154(b) by 806 days.

(21) Appl. No.: 13/195,385

(22) Filed: Aug. 1, 2011

(65) Prior Publication Data

US 2012/0113555 A1    May 10, 2012

Related U.S. Application Data

(60) Provisional application No. 61/412,081, filed on Nov. 10, 2010.

(51) Int. Cl.
*H02H 3/00* (2006.01)
*H02H 3/06* (2006.01)
*H02H 3/07* (2006.01)

(52) U.S. Cl.
CPC .............. *H02H 3/066* (2013.01); *H02H 3/07* (2013.01)

(58) Field of Classification Search
CPC ...................................................... H02H 3/07
USPC ............ 700/292; 361/59, 61, 62, 71, 72, 74
See application file for complete search history.

(56) References Cited

U.S. PATENT DOCUMENTS

| 2,384,362 | A |  | 9/1945 | Anderson |  |
|---|---|---|---|---|---|
| 4,454,555 | A |  | 6/1984 | DeLacy |  |
| 4,994,934 | A |  | 2/1991 | Buhenguel |  |
| 5,345,180 | A |  | 9/1994 | Maier |  |
| 5,604,385 | A |  | 2/1997 | Yair |  |
| 5,644,293 | A |  | 7/1997 | Right |  |
| 5,650,728 | A |  | 7/1997 | Rhein |  |
| 5,748,008 | A |  | 5/1998 | Landreth |  |
| 5,768,079 | A |  | 6/1998 | Buell |  |
| 5,784,239 | A |  | 7/1998 | Buhenguel |  |
| 6,262,871 | B1 | * | 7/2001 | Nemir et al. | 361/42 |
| 6,452,767 | B1 |  | 9/2002 | Brooks |  |
| 6,667,866 | B1 |  | 12/2003 | LaPlace |  |

(Continued)

FOREIGN PATENT DOCUMENTS

| CA | 2086650 A1 | 7/1994 |
|---|---|---|
| CN | 1625008 A | 6/2005 |

(Continued)

OTHER PUBLICATIONS

Terzija et al., "Novel numerical algorithm for overhead lines protection and adaptive autoreclosure" Seventh International Conference on (IEE) Developments in Power System Protection, 2001, Apr. 9, 2001-Apr. 12, 2001, pp. 387-390.*

(Continued)

*Primary Examiner* — Emilio J Saavedra
(74) *Attorney, Agent, or Firm* — Taft Stettinius & Hollister LLP; J. Bruce Schelkopf

(57) ABSTRACT

Fault interrupting devices and methods for controlling the same are disclosed. The fault interrupting devices may include a switch on an electrical power line and a controller configured to operate the switch. The methods for controlling fault interrupting devices may include gathering data, determining from the data that a fault has occurred, opening the fault interrupting device to interrupt the fault, analyzing the data, and determining whether the fault interrupting device can be reclosed based at least partially on the analysis of the data.

28 Claims, 3 Drawing Sheets

(56) References Cited

U.S. PATENT DOCUMENTS

| | | | |
|---|---|---|---|
| 6,687,573 | B2 | 2/2004 | Egolf |
| 6,707,655 | B2 | 3/2004 | McElray |
| 6,735,533 | B2 | 5/2004 | McClure |
| 6,735,534 | B2 | 5/2004 | McClure |
| 6,778,370 | B1 | 8/2004 | LaPlace |
| 6,807,035 | B1 | 10/2004 | Baldwin |
| 6,867,958 | B2 | 3/2005 | McClure |
| 6,960,844 | B1 | 11/2005 | Al-Hosini |
| 6,972,937 | B1 | 12/2005 | Macbeth |
| 7,075,309 | B2 | 7/2006 | Smith |
| 7,110,231 | B1 | 9/2006 | La Ree |
| 7,242,110 | B2 | 7/2007 | Matsumoto |
| 7,405,910 | B2 | 7/2008 | Maitra |
| 7,420,791 | B1 | 9/2008 | Dong |
| 7,626,397 | B2 | 12/2009 | Opfer |
| 7,672,108 | B2 | 3/2010 | Moninski |
| 7,773,360 | B2 | 8/2010 | O'Leary |
| 8,000,069 | B2 | 8/2011 | Montenegro |
| 8,072,727 | B2 | 12/2011 | O'Leary |
| 8,125,751 | B2 | 2/2012 | Cavanna |
| 8,339,141 | B2 | 12/2012 | Gray |
| 8,392,129 | B2 | 3/2013 | Gabello |
| 8,412,386 | B2 | 4/2013 | Fickey |
| 8,681,462 | B2 | 3/2014 | O'Leary |
| 2002/0080540 | A1* | 6/2002 | McElray et al. ............... 361/59 |
| 2004/0105204 | A1 | 6/2004 | McElray |
| 2007/0109701 | A1* | 5/2007 | Fickey ............... 361/62 |
| 2008/0024142 | A1* | 1/2008 | Opfer et al. ............... 324/555 |
| 2008/0266733 | A1 | 10/2008 | O'Leary |
| 2008/0303615 | A1 | 12/2008 | Hardesty |
| 2008/0309437 | A1 | 12/2008 | Smith |
| 2009/0046400 | A1 | 2/2009 | McCarthy |
| 2009/0290275 | A1 | 11/2009 | Staszesky |
| 2012/0074779 | A1 | 3/2012 | Black et al. |
| 2012/0250202 | A1 | 10/2012 | Montenegro |

FOREIGN PATENT DOCUMENTS

| | | |
|---|---|---|
| CN | 101297447 A | 10/2008 |
| CN | 101849336 A | 9/2010 |
| EP | 1580859 | 9/2005 |
| EP | 2019467 A1 | 1/2009 |
| EP | 2139087 | 12/2009 |
| GB | 252134 | 4/1926 |
| GB | 252134 | 11/1926 |
| GB | 2303005 | 2/1997 |
| WO | 2007011196 A1 | 1/2007 |
| WO | WO 2007/050241 | 5/2007 |
| WO | 2008097982 | 8/2008 |
| WO | 2009143197 | 11/2009 |
| WO | WO 2010/022559 | 3/2010 |

OTHER PUBLICATIONS

Le Blond et al., "A Review of Artificial Intelligence Techniques as Applied to Adaptive Autoreclosure, with Particular Reference to Deployment with Wind generation" 2009 Proceedings of the 44th International Universities Power Engineering Conference (UPEC), Sep. 1-4, 2009 pp. 1-5.*

T. A. Short, "Electric Power Distribution Handbook," 2004, pp. 428-437, CRC Press, Boca Raton, Florida.

H. Qiang, L Yongli, Li Bin, "A New Adaptive Autoreclosure Scheme to Distinguish Transient Faults from Permanent Faults," Proceedings of International Conference on Power System Technology (PowerCon 2002), 2002, pp. 671-674, IEEE.

S&C Electric Company, "S&C's IntelliRupter® PulseCloser eliminates the need to close into a fault to test the line," 2009, S&C Electric Company.

S&C Electric Company, IntelliRupter® PulseCloser for Automated Overhead Distribution, http://www.sandc.com/products/switching-overhead-distribution/intellirupter-pulsecloser.asp, webpage printed Aug. 1, 2011.

S&C Electric Company, IntelliRupter® PulseCloser for Overhead Distribution System Protection (Recloser), webpage printed Aug. 1, 2011 from http://web.archive.org/web/20090602040423/http://www.sandc.com/products/intellirupter/default.asp.

S&C Electric Company, "S&C IntelliRupter® PulseCloser Outdoor Distribution 14.4 kV and 25 kV," Descriptive Bulletin 766-30, Feb. 7, 2006.

S&C Electric Company, "S&C IntelliRupter® PulseCloser Outdoor Distribution (15.5 kV and 27 kV)," Instruction Sheet 766-500, Mar. 15, 2010.

S&C Electric Company, "S&C IntelliRupter® PulseCloser Outdoor Distribution (15.5 kV and 27 kV)," Instruction Sheet 766-540, Mar. 15, 2010.

S&C Electric Company, S&C IntelliRupter® PulseCloser Outdoor Distribution, 15.5 kV and 27 kV, Descriptive Bulletin 766-30, Mar. 22, 2010.

S&C Electric Company, IntelliRupter® PulseCloser—Product Literature, webpage printed Jun. 7, 2010.

Unknown, "Applications Assessment of Pulse Closing Technology—A Joint Project of the Electric Power Research Institute and Hydro-Quebec," Technical Paper 766-T85, file created and modified Aug. 18, 2009.

A. Trifonov, International Searching Authority (EPO), International Search Report and Written Opinion of the International Searching Authority for corresponding International Application No. PCT/US2011/046113, European Patent Office, dated Nov. 10, 2011.

J.-H. Oh; S.-Y. Yun; J.-C. Kim; E.-S. Kim, "Particular Characteristics Associated with Temporary and Permanent Fault on the Multi-Shot Reclosing Scheme," IEEE Power Engineering Society Summer Meeting, 2000, pp. 421-424.

V. V. Terzija, and Z. M. Radojevic, "Numerical Algorithm for Adaptive Autoreclosure and Protection of Medium-Voltage Overhead Lines," IEEE Transactions on Power Delivery, vol. 19, No. 2, 2004, pp. 554-559.

R. K. Aggarwal, A. T. Johns, Y. H. Song, R. W. Dunn, and D. S. Fitton, "Neural-Network Based Adaptive Single-Pole Autoreclosure Technique for EHV Transmission Systems," IEE Proceedings Generation, Transmission and Distribution, vol. 141, No. 2, 1994, pp. 155-160.

B. D. Russell and R. P. Chinchali, "A Digital Signal Processing Algorithm for Detecting Arcing Faults on Power Distribution Feeders," IEEE Transactions on Power Delivery, vol. 4, No. 1, 1989, pp. 132-140.

S&C Electric Company, "S&C IntelliRupter® PulseCloser Outdoor Distribution (15.5 kV and 27 kV)," Specification Bulletin 766-31, Sep. 20, 2010.

Hipotronics, Time Domain Reflectometer TDR 1170, Datasheet TDR1170-DS, 2009.

Hipotronics, HVC4000 Series High Voltage TDR Couplers, Datasheet HVC 4000-DS, 2010.

Hipotronics, CET-2000 Controlled Energy Capacitive Discharge Cable Fault Locator, Datasheet CET2000-DS, 2009.

Hipotronics, 5250 Series—High Energy Capacitive Discharge (Thumpers) Portable Cable Fault Locating Systems, Datasheet 5250-DS, 2010.

The Patent Office of the People's Republic of China, Office Action for corresponding Chinese patent application No. 200080054182.5, dated Aug. 27, 2014.

Steven Hudnut, Instructions and Claims for Response to Office Action dated Aug. 27, 2014 for corresponding Chinese patent application No. 200080054182.5, dated Mar. 1, 2015.

Kulkarni, S.; Duehee Lee; Allen, A.J.; Santoso, S.; Short, T.A., "Waveform characterization of animal contact, tree contact, and lightning induced faults," 2010 IEEE Power and Energy Society General Meeting, pp. 1-7, 2010.

* cited by examiner

FAULT INTERRUPTING DEVICES AND CONTROL METHODS THEREFOR

CROSS REFERENCE TO RELATED APPLICATION(S)

This application claims the benefit of and priority to U.S. Provisional Patent Application Ser. No. 61/412,081, which was filed on Nov. 10, 2010 and is entitled "FAULT INTERRUPTING DEVICES AND CONTROL METHODS THEREFOR." The complete disclosure of the above-identified patent application is hereby incorporated by reference for all purposes.

FIELD OF THE DISCLOSURE

The present disclosure relates to electric power system fault interrupting devices, and more particularly to the operation of reclosers or reclosing breakers.

BACKGROUND

Reclosers are electromechanical switches that open and close one or more phases of an electrical power line, such as between a substation and a load, such as in response to an overcurrent in the power line. As used herein, it should be understood that the term "recloser" may include various combinations of fault interrupting devices, such as reclosers, reclosing circuit breakers and the like.

In general, when an overcurrent of sufficient magnitude and duration, such as greater than a predetermined amount of current and longer than a predetermined period of time, flows through a recloser, a tripping action is initiated, circuit interrupting contacts open, and an operation counter advances one count. After a preset time delay, the circuit interrupting contacts may be automatically reclosed, thereby re-energizing the line. If the fault was temporary, such as where the fault is momentary or transient, such as due to a tree branch or animal momentarily contacting the line, and the fault was cleared before the recloser was reclosed, the recloser will remain closed and reset to its original condition after a short time delay such that the recloser is ready for the next operation. If the fault was not cleared before the recloser was reclosed the first time, the tripping action is again initiated to open the circuit interrupting contacts. The recloser will automatically reclose the contacts after a further, and typically longer, time delay.

However, not all faults that occur on electrical power lines are temporary. Rather, some faults are of a more persistent or permanent nature, such as where a storm causes an entire pole structure to fall to the ground. In response to a permanent fault, the tripping and reclosing sequence will repeat a predetermined number of times, as counted by the operation counter, until a lockout function is initiated to lock the circuit interrupting contacts open and prevent further reclosings into a permanent fault. Thus, as may be understood, the recloser will have reclosed into a permanent fault, and passed the available fault current into the circuit, several times before completing the entire reclosing cycle and locking-out to prevent further reclosing of the circuit interrupting contacts.

Examples of reclosers and their functions and operations are disclosed in U.S. Pat. No. 5,768,079, in U.S. Patent Application Publication Nos. 2004/0105204 and 2008/0266733, and in "Electric Power Distribution Handbook," by T. A. Short (CRC Press, Boca Raton, Fla., © 2004). The disclosures of these and all other publications referenced herein are incorporated by reference in their entirety for all purposes.

SUMMARY

In some examples, methods for controlling a fault interrupting device may include gathering data, determining from the data that a fault has occurred, opening the fault interrupting device to interrupt the fault, analyzing the data, and determining whether the fault interrupting device can be reclosed based at least partially on the analysis of the data.

In some examples, computer readable storage media may have embodied thereon a plurality of machine-readable instructions configured to be executed by a computer processor to control a recloser on an electrical power line. The plurality of machine-readable instructions may include instructions to gather data, instructions to determine from the data that a fault has occurred on the power line, instructions to open the recloser to interrupt the fault, instructions to analyze the data, and instructions to determine whether the recloser can be reclosed based at least partially on the analysis of the data.

In some examples, fault interrupting devices may include a switch on an electrical power line and a controller configured to operate the switch. The controller may include at least one processor configured to execute instructions to perform a method. The instructions may include instructions to gather data regarding the power line, determine from the data that a fault has occurred on at least one phase of the power line, open the switch to interrupt the fault, analyze the data, and determine whether the switch should be reclosed based at least partially on the analysis of the data.

DETAILED DESCRIPTION

Figure 1:
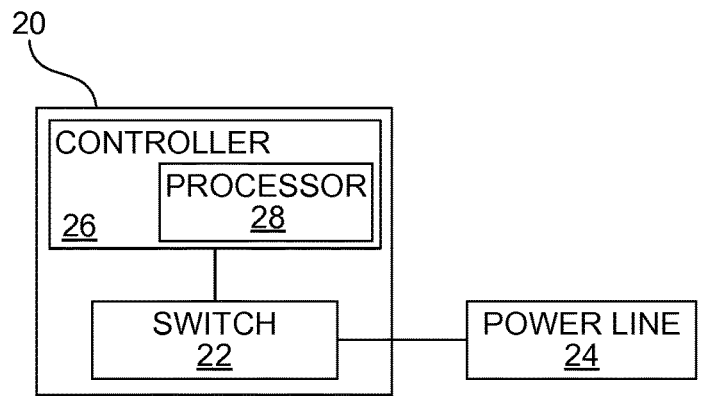
FIG. 1 is a block diagram illustrating a nonexclusive illustrative example of a fault interrupting device suitable for use with the disclosed control methods.

A nonexclusive illustrative example of a fault interrupting device, such as a recloser, is shown generally at 20 in FIG. 1. Unless otherwise specified, the fault interrupting device 20 may, but is not required to, contain at least one of the structures, components, functionalities, and/or variations described, illustrated, and/or incorporated herein.

The fault interrupting device 20 includes a circuit-breaking switch 22 on at least one phase of an electrical distribution or power line 24, and at least one controller 26 configured to operate the switch 22. The circuit-breaking switch 22 may be configured to carry relatively high current loads, interrupt faults on at least one phase of the electrical distribution or power line 24, and reclose the line. In some examples, the circuit-breaking switch 22 may be or include a high-speed circuit breaker and/or a vacuum or sulfur hexafluoride ($SF_6$) interrupter assembly. The controller 26, which may be electronic, may include at least one processor 28, which may be a microprocessor, that is configured to execute instructions to carry out at least a portion of a method for controlling the fault interrupting device 20. In some examples, the fault interrupting device 20 may include overcurrent protection, trip logic, and/or automatic closing logic with an operation counter. Nonexclusive illustrative examples of fault interrupting devices suitable for use with the control methods disclosed herein include the VR-3S and OVR-3 vacuum reclosers manufactured and distributed by ABB Inc., Lake Mary, Fla.

The following paragraphs describe nonexclusive illustrative examples of control methods for fault interrupting devices, using the concepts and components disclosed herein, which methods may be at least partially carried out by the fault interrupting device controller 26. Although the actions of the disclosed methods may be performed in the orders in which they are presented below, it is within the scope of this disclosure for the actions, either alone or in various combinations, to be performed before and/or after any of the other actions.

Figure 2:
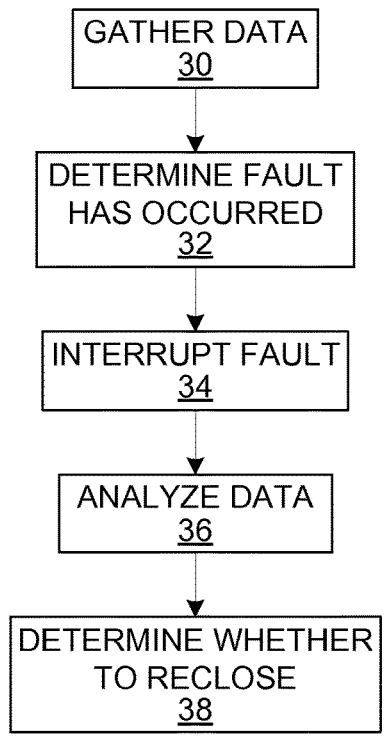
FIG. 2 is a block diagram illustrating a nonexclusive illustrative example of a control method for fault interrupting devices.

As schematically illustrated in the block diagram of FIG. 2, control methods for fault interrupting devices may include gathering data regarding the power line (block 30), determining from the data that a fault has occurred on at least one phase of the power line (block 32), opening the switch of the fault interrupting device to interrupt the fault (block 34), analyzing the data (block 36), and determining whether the fault interrupting device can and/or should be reclosed based at least partially on the analysis of the data (block 38).

The gathered data may include any available data that may at least partially be used to identify the occurrence of a fault and/or to characterize the fault. Nonexclusive illustrative examples of such data include current, voltage, phasor and/or impedance measurements for at least one phase of the power distribution line protected by the fault interrupting device. In some examples, the gathered data may include information regarding weather or other environmental conditions proximate the fault interrupting device and/or the power line.

The occurrence of a fault, such as an over-current in at least one phase of the power distribution line protected by the fault interrupting device, may be determined using any suitable method, as known in the art. Examples of fault detection are disclosed in the references cited above, and additional examples of fault detection are disclosed in U.S. Pat. Nos. 7,420,791 and 6,972,937, the complete disclosures of which are incorporated by reference in their entirety for all purposes.

The data analysis and corresponding determination whether the fault interrupting device can and/or should be reclosed may include determining from the data whether the fault is a momentary fault or a permanent fault. As used herein, a "momentary fault" is a fault of momentary, transient or temporary nature that is, or will be, cleared before at least one of the attempted reclosings of the fault interrupting device, while a "permanent fault" is a fault that is not, or will not be, cleared before the fault interrupting device locks out after performing its entire cycle of reclosing attempts.

Fault interrupting devices, such as reclosers, may impose a delay before making a reclosing attempt. Such delays can vary between different utilities and between distribution feeders. For example, the delay for a first reclosing attempt may range from less than one second, such as about 0.17 to about 0.5 seconds (about ten (10) to about thirty (30) cycles on a 60 Hz system), to several seconds. For subsequent reclosing attempts, the delay may be on the order of several seconds to several tens of seconds. These periods of time may provide sufficient processor clock time to perform at least one analysis on the gathered data to determine whether a detected and interrupted fault is momentary or permanent, to determine whether the fault interrupting device can and/or should be reclosed in view of the determination regarding the nature of the fault, and to perform appropriate control actions based on the determinations.

A fault interrupting device controller may need to consider at least a few cycles, such as at least two (2) or three (3) cycles, worth of data recorded during the fault in order to determine that a fault has occurred. If the occurrence of a fault has been determined, the controller may execute a fault signature analysis on the gathered fault data to determine whether the fault is momentary or permanent. The fault signature analysis may be executed on the recorded fault data while the switch of the fault interrupting device is open.

The determination of whether the fault is momentary or permanent may use, or be based, on any suitable analysis of the gathered data. For example, the harmonic content, peaks, magnitude, frequency, and/or other features of the data in the time-frequency domain may be analyzed. For purposes of illustration, examples of current over time are plotted in FIGS. 3 and 4, with a nonexclusive illustrative example of a momentary fault shown in FIG. 3 and a nonexclusive illustrative example of a permanent fault shown in FIG. 4. It should be understood that the plots shown in FIGS. 3 and 4 illustrate some of the general features of momentary and permanent faults and are not intended to represent specific faults.

Figure 3:
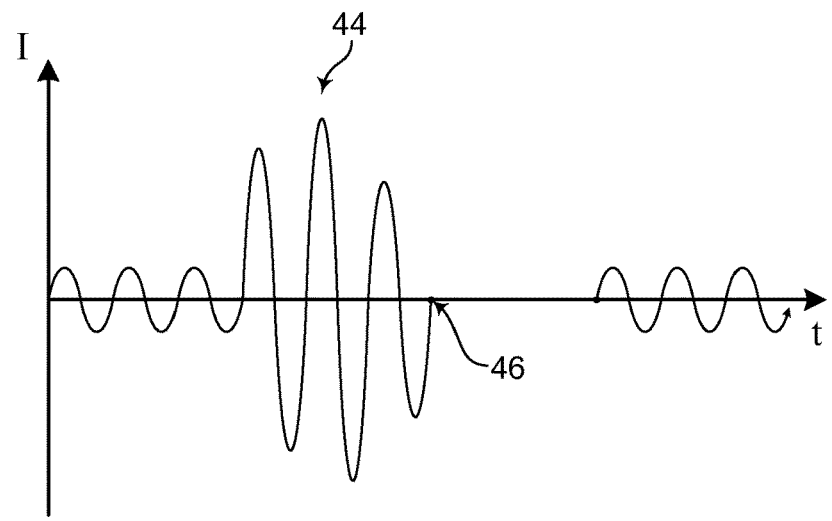
FIG. 3 is a plot of current over time for a nonexclusive illustrative example of a momentary fault that has been interrupted by a fault interrupting device, which has reclosed after the fault has cleared.

As may be seen from FIG. 3, the fault signal for a momentary fault, as generally indicated by 44, may exhibit a dynamically varying magnitude and/or frequency spectrum over the cycles of data recorded prior to the fault interrupting device opening to interrupt the fault at 46. Thus, for example, the momentary nature of the fault could be determined by identifying a cycle-to-cycle variation in the current magnitude, in its frequency spectrum, and/or in a measured impedance.

Figure 4:
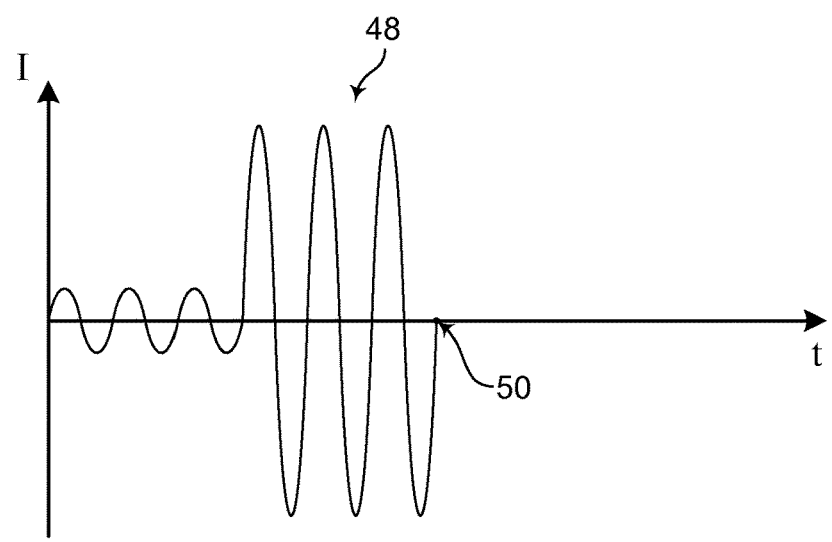
FIG. 4 is a plot of current over time for a nonexclusive illustrative example of a permanent fault that has been interrupted by a fault interrupting device.

In contrast to a momentary fault, the fault signal for a permanent fault, as generally indicated by 48 in FIG. 4, may exhibit a lack of dynamic variation, such as a relatively constant or stationary magnitude and/or frequency spectrum, over the cycles of data recorded prior to the fault interrupting device opening to interrupt the fault at 50. Thus, for example, the permanent nature of the fault could be determined by identifying a lack of cycle-to-cycle variation in the current magnitude and/or frequency spectrum or in a measured impedance.

In some examples, the gathered data may be compared to historical fault data for which the momentary or permanent nature of the fault is known. For example, the gathered data may be compared to data gathered during prior reclosings of the fault interrupting device. In some examples, such as where a particular feeder or power distribution line is notorious for faults, fault data for a particular location may be gathered to produce a signature library for momentary and permanent faults, which may be used to create a momentary or permanent fault determination algorithm.

Based on the results of the analysis, if the controller determines that the fault is, or is likely to be, a momentary fault, the methods may include reclosing the fault interrupting device and/or determining that reclosing the fault interrupting device is permissible. Thus, for example, if the controller determines that the fault is, or is likely, a momentary fault, the controller may proceed with the normal reclosing cycle.

In contrast, if the controller determines that the fault is, or is likely to be, a permanent fault, the methods may include determining that the fault interrupting device should be locked open and/or locking the fault interrupting device open. Accordingly, if the controller determines that the fault is, or is likely, a permanent fault, the controller may lock-out the fault interrupting device, without performing any further reclosings. Thus, rather than repeatedly reclosing the fault interrupting device into a permanent fault, which is unlikely to have cleared, the controller may prevent some reclosings into a permanent fault, which may reduce the potentially damaging electrical, thermal and/or mechanical stresses applied to feeder equipment, and to the interrupting device itself, that would otherwise result from reclosing into a permanent fault.

In some examples, the controller may even lock the fault interrupting device open before reclosing into the fault if the fault is determined to be, or likely to be, a permanent fault. In particular, if the controller makes the permanent fault determination based on the data that was gathered before the first opening of the fault interrupting device to interrupt the fault, and the determination is made prior to the first reclosing, all reclosings into a permanent fault can be prevented. As may be understood, preventing reclosing into a permanent fault may prevent the potentially damaging effects to feeder equipment and/or to the fault interrupting device itself that may result from reclosing into an ongoing fault.

Furthermore, reducing the number of reclosings into permanent faults that are unlikely to have been cleared, may reduce operational wear on the fault interrupting device itself. In particular, if the fault is determined to be permanent, the full resclosing cycle will not be performed, such that the number of reclosings is reduced. Reducing the number of reclosings may extend the service life of the fault interrupting device and/or any components thereof that have a service life that may be measured by or rated for a certain number of reclosings. Such components may include the contacts and, in the case of gas or vacuum reclosers, the gas or vacuum bottles.

In some examples, the determination of whether a fault is momentary or permanent is probabilistic. For example, the controller may determine from the gathered data a probability that the fault is a permanent fault. If the probability is above a predetermined threshold or confidence level, the controller may override the normal reclosing cycle, block the next reclosing, and lock the fault interrupting device open. The predetermined threshold may be set by the operator or utility associated with the fault interrupting device. Nonexclusive illustrative examples of predetermined thresholds, may include about 50%, 60%, 70%, 75%, 80%, 90% and 100%. As may be understood, a lower predetermined threshold or confidence level may be useful when, for example, it is desired to minimize fault current passed through the recloser and/or reduce the total number of reclosing attempts, while a higher predetermined threshold or confidence level may be useful when, for example, it is desired to maintain service reliability in the protected portions of the distribution line.

Correspondingly, if the controller determines that the probability that the fault is a permanent fault is below the predetermined threshold, the controller may permit the fault interrupting device to proceed with the normal reclosing cycle. In particular, when the probability is below the predetermined threshold or confidence level, the controller may override the method in favor of a normal cycle of reclosing and re-opening until the fault has cleared or the fault interrupting device locks out. Thus, the controller may determine whether the fault interrupting device has performed less than a predetermined number of reclosing attempts and reclose the fault interrupting device if the fault interrupting device has performed less than the predetermined number of reclosing attempts and the probability is below the predetermined threshold. In such an example, the predetermined number of reclosing attempts may be the maximum number of permitted reclosing attempts before the fault interrupting device locks out.

In some examples, the controller may be configured to selectively allow normal operation of the fault interrupting device, including proceeding with a normal cycle of reclosings until the fault has cleared or the fault interrupting device has locked out. For example, the aforementioned functionalities may be disabled on certain days due to weather conditions, such as storms.

In some examples, the gathered data may include information regarding environmental conditions, such as proximate the power line and/or the fault interrupting device. In such examples, the fault interrupting device may be configured such that the controller determines whether the fault is a permanent fault based on the data when the environmental conditions are within predefined limits, but when the environmental conditions are outside predefined limits, the controller determines whether the fault interrupting device should reclose or be locked open independent of whether the fault is a momentary fault or a permanent fault. For example, the controller may permit a normal cycle of reclosings when the environmental conditions are outside predefined limits, and only lock open the fault interrupting device based on the number of reclosings made into a fault. Nonexclusive illustrative examples of predefined limits for environmental conditions may include any suitable combination of wind speed, temperature, humidity, precipitation, or the like, which may be indicative of a storm.

In some examples, additional or second data may be gathered after reclosing the fault interrupting device. The additional data may be gathered after the first reclosing, or even after subsequent additional reclosings. Based on the additional data, the controller may determine that the fault has not been cleared and re-open the fault interrupting device to re-interrupt the fault. At this point, the controller will have at least two sets of fault data available: the original or first set data gathered before the initial opening of the fault interrupting device and the additional or second set or sets of data gathered between a reclosing and subsequent re-opening of the fault interrupting device. The controller may then analyze at least one of the at least two sets of data to determine whether the fault is a momentary fault or a permanent fault.

In some examples, the controller may compare attributes of the first, second and/or any additional sets of data to each other as part of the analysis to determine whether the fault is a momentary fault or a permanent fault, which may provide an increased probability and/or confidence that the permanent or momentary nature of the fault has been correctly determined. For example, the controller may make an assumption that conditions did not change between the times during which the first and second sets of data were gathered and use the attributes of the first set of data as a reference for comparison against the attributes of the second or later sets of data. If the attributes of the second or later sets of data are determined to be substantially similar to, or the same as, the attributes of the first set of data, the controller may determine that the fault is likely permanent. However, if the attributes of the second or later sets of data are determined to be different from the attributes of the first set of data, the controller may determine that the fault might be momentary.

If the fault is permanent, the controller may block further reclosing of the fault interrupting device. However, if the fault is momentary, the controller may determine whether the fault interrupting device has completed its cycle of reclosings and already performed a predetermined or maximum number of reclosings. The controller may reclose the fault interrupting device after interrupting a fault determined to be momentary if the fault interrupting device has not already completed its cycle of reclosings. However, if the fault interrupting device has already performed the maximum number of reclosings, the controller may lock open the fault interrupting device regardless of whether the fault is determined to be momentary.

In some examples, the controller may repeat the process of reclosing the fault interrupting device, gathering and analyzing data, and attempting to determine whether the fault is momentary or permanent until the fault interrupting device has performed a predetermined number of reclosings. Thus, for example, if the controller cannot make a determination that the fault is permanent, with a sufficient reliability or confidence level, the controller will effectively operate the fault interrupting device in a normal manner, and perform a normal cycle of reclosings until the fault has cleared, or the fault interrupting device locks out after performing a predetermined number of reclosings. Providing for normal fault interrupting device operation if a permanent fault determination is not confidently made, may reduce or avoid adverse impacts on reliability measures such as the System Average Interruption Duration Index (SAIDI) and the System Average Interruption Frequency Index (SAIFI).

Figure 5:
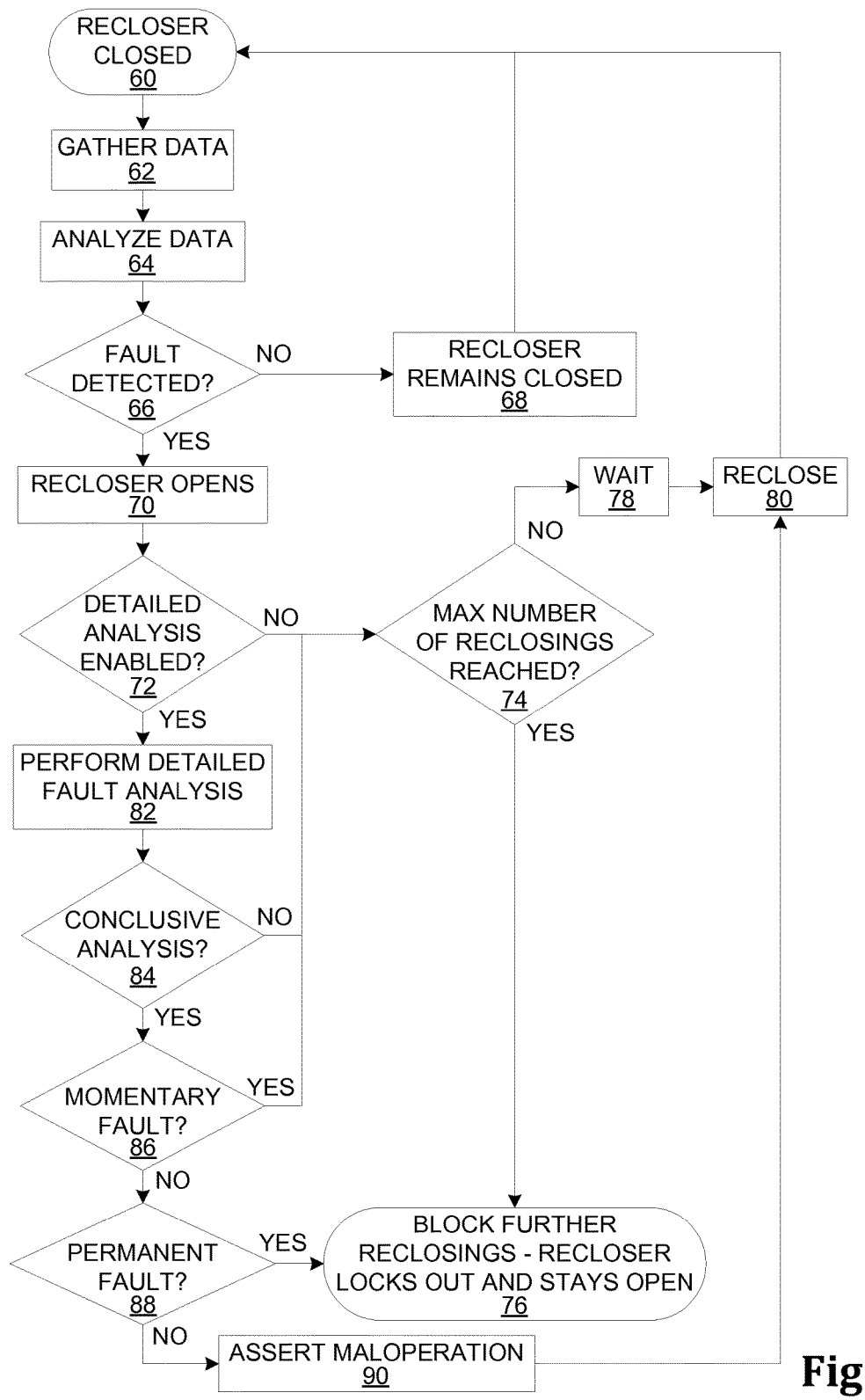
FIG. 5 is a flowchart illustrating another nonexclusive illustrative example of a control method for fault interrupting devices.

FIG. 5 is a flowchart illustrating another nonexclusive illustrative example of a control method for fault interrupting devices such as a recloser, which may be at least partially carried out by the fault interrupting device controller 26. As shown, the method may begin with the recloser closed, as indicated in block 60. Data may be gathered, as indicated by block 62, and analyzed to determine whether a fault has been detected, as indicated by blocks 64 and 66. If the analysis determines that a fault has not been detected, the recloser remains closed, as indicated by block 68, and the process continues with the recloser being closed and data being gathered and analyzed, as indicated by blocks 60, 62 and 64.

If the analysis of blocks 64 and 66 determines that a fault was detected, the recloser opens, as indicated by block 70. As indicated at block 72, the controller may determine whether or not the detailed analysis feature has been enabled. If the detailed analysis has not been enabled, such as due to adverse weather conditions or maintenance, the controller takes the recloser through its normal cycle of reclosings. In particular, the controller determines whether the maximum number of reclosings has been reached, as indicated at block 74. If the maximum number of reclosings has been reached, the controller blocks further reclosing attempts and locks out the recloser, which will then stay open, as indicated at block 76. If the maximum number of reclosings has not been reached, the controller waits through the delay period determined for the particular upcoming reclosing, as indicated at block 78, with the length of the delay period typically being a function of the next reclosing's position within the reclosing cycle. After the delay period, the controller instructs the recloser to reclose, as indicated at block 80, and the process continues with the recloser being closed and data being gathered and analyzed, as indicated by blocks 60, 62 and 64. The process may then continue until the maximum number of reclosings has been reached or the fault has been cleared.

If the detailed analysis has been enabled, the detailed fault analysis may be performed, as indicated at block 82, which may determine whether the fault is momentary or permanent. If the results of the detailed fault analysis are determined at block 84 to be not conclusive, the controller will reclose the recloser, unless the maximum number of reclosings has been reached, such that a second set of data may be gathered and analyzed if the fault has not yet been cleared prior to the reclosing. As noted above, the second and subsequent fault analyses may include a comparative analysis of the data gathered during the initial fault and/or during one or more reclosings, which may increase the chances of achieving a conclusive analysis.

If the results of the detailed fault analysis are determined at block 84 to be conclusive, with a determination that the fault is a momentary fault, as indicated at block 86, the controller will perform a reclosing, as indicated at block 80, unless the maximum number of reclosings has been reached, in which case the controller will block further reclosing attempts and lock out the recloser, which will then stay open, as indicated at block 76. If the results of the detailed fault analysis are determined at block 84 to be conclusive, with a determination that the fault is a permanent fault, as indicated at block 88, the controller will block further reclosing attempts and lock out the recloser, as indicated at block 76.

If, however, the results of the detailed fault analysis are determined at block 84 to be conclusive, but the fault is not determined to be either a momentary or permanent fault, as indicated at blocks 86 and 88, the controller may assert that it has detected a "maloperation" of the fault interrupting device, as indicated at block 90. Maloperation of the device may indicate that the recloser opened, for example, in the absence of a fault, contrary to a predetermined set of criteria for opening the recloser, and/or as a result of miscoordination. In particular, the recloser should only open automatically in response to a fault or, in some examples, where conditions warrant opening the recloser to support coordination between the recloser and another downstream and/or upstream fault interrupting device. However, if the recloser opens, and a conclusive analysis indicates that neither a momentary nor a permanent fault occurred, then the recloser has maloperated and opened in the absence of a fault and/or miscoordinated with other interrupting devices. If maloperation is asserted, the controller will reclose the recloser, as indicated at block 80. In some examples, the controller may assert maloperation of the device when the recloser fails to open in response to a fault and/or as is required for coordination with another downstream and/or upstream fault interrupting device.

In some examples, the disclosed methods may be implemented as a software- or firmware-based modification to existing reclosers, where the recloser controller may rely on the existing hardware such as the sensors, processors, actuators, charging equipment, and the like.

In some examples, the disclosed methods may be adapted for use with various suitable fault interrupting devices in electrical generation, transmission, and distribution systems, such as where a time-based reclosing function is desired and/or enabled.

The disclosed methods and systems may be embodied as or take the form of the methods and systems previously described, as well as of a transitory or non-transitory computer readable medium having computer-readable instructions stored thereon which, when executed by a processor, carry out operations of the disclosed methods and systems. The computer-readable medium may be any medium that can contain, store, communicate, propagate, or transport the program instructions for use by or in connection with the instruction execution system, apparatus, or device and may, by way of example but without limitation, be an electronic, magnetic, optical, electromagnetic, infrared, or semiconductor system, apparatus, device, or propagation medium or other suitable medium upon which the program is recorded. More specific examples (a non-exhaustive list) of such a computer-readable medium may include: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Computer program code or instructions for carrying out operations of the disclosed methods and systems may be written in any suitable programming language provided it allows achieving the previously described technical results.

The instructions may be configured for execution on any device having sufficient processing power. For example, the processor that executes the instructions may be a part of the fault interrupting device controller, as noted above, or the processor may be a part of an associated device such as a suitable intelligent electronic device (IED) or remote terminal unit (RTU) or a station computer.

In some examples, various portions of the instructions may be executed on multiple processors located at different locations, which may be remote from one another. Each of the multiple processors may have a processing power sufficient to execute one or more of the various portions of the instructions. For example, the data analysis instructions may be executed at a remote location, such as a station computer, with the recloser control instructions being executed by the fault interrupting device controller.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the disclosure includes all novel and non-obvious combinations and subcombinations of the various elements, features, functions and/or properties disclosed herein. Similarly, recitation in the disclosure and/or the claims of "a" or "a first" element, or the equivalent thereof, should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

What is claimed is:

1. A method for controlling a fault interrupting device, the method comprising:
    gathering data before opening the fault interrupting device to interrupt a fault;
    determining from the gathered data. that the fault has occurred;
    opening the fault interrupting device to interrupt the fault;
    while the fault interrupting device remains open, analyzing the gathered data to determine if the fault is a permanent fault; and
    determining, before reclosing the fault interrupting device, that the fault interrupting device should be locked open if the analysis of the gathered data determines that the fault is a permanent fault.

2. The method of claim 1, wherein analyzing, the gathered data to determine if the fault is a permanent fault comprises analyzing the gathered data to determine if the fault is a momentary fault or is neither a momentary fault nor a permanent fault, and the method comprises determining, before reclosing the fault interrupting device, that the fault interrupting device can be reclosed if the analysis of the gathered data determines that the fault is a momentary fault or is neither a momentary fault nor a permanent fault.

3. The method of claim 1, comprising:
    reclosing the fault interrupting device if the analysis of the data determines that the fault is a momentary fault;
    reclosing the fault interrupting device if the analysis of the data determines that the fault is neither, a momentary fault nor a permanent fault; and
    locking the fault interrupting device open if the analysis of the data determines that the fault is a permanent fault.

4. The method of claim 3, wherein the fault interrupting device is locked open before reclosing into the fault if the analysis of the data before reclosing the fault interrupting device determines that the fault is a permanent fault.

5. The method of claim 1, wherein the data gathered before opening the fault interrupting device to interrupt the fault is first data, and the method comprises:
    reclosing the fault interrupting device if the analysis of the first data does not determine that the fault is a permanent fault;
    gathering second data after reclosing the fault interrupting device; and
    analyzing at least one of the first and second data to determine whether the fault is a momentary fault or a permanent fault.

6. The method of claim 5, wherein analyzing at least one of the first and second data to determine whether the fault is a momentary fault or a permanent fault includes comparing the second data to the first data.

7. The method of claim 5, comprising;
    determining from the second data that the fault has not been cleared;
    re-opening the fault interrupting device to re-interrupt the fault;
    reclosing the fault interrupting device if analyzing at least one of the first and second data to determine whether the fault is a momentary fault or a permanent fault does not determine that the fault is a permanent fault; and
    blocking further reclosing of the fault interrupting device if analyzing at least one of the first and second data to determine whether the fault is a momentary fault or a permanent fault determines that the fault is a permanent fault.

8. The method of claim 5, comprising:
determining from the second data that the fault has not been cleared;
re-opening the fault interrupting device to re-interrupt the fault;
performing an additional reclosing of the fault interrupting device if the fault interrupting device has performed less than a predetermined number of reclosings;
gathering third data after the additional reclosing; and
analyzing at least one of the first, second and third data to determine whether the fault is a momentary fault or a permanent fault.

9. The method of claim 1, comprising:
determining from the gathered data a probability that the fault is a permanent fault; and
locking the fault interrupting device open if the probability is above a predetermined threshold.

10. The method of claim 9, comprising:
determining whether the fault interrupting device has performed less than a predetermined number of reclosing attempts; and
reclosing the fault interrupting device if the fault interrupting device has performed less than the predetermined number of reclosing attempts and the probability is below the predetermined threshold.

11. The method of claim 1, wherein the data includes information regarding environmental conditions, and the method comprises:
analyzing the gathered data to determine if the fault is a permanent fault when the environmental conditions are within predefined limits; and
permitting reclosing of the fault interrupting device when the environmental conditions are outside the predefined limits.

12. A non-transitory computer readable storage medium having embodied thereon a plurality of machine-readable instructions configured to be executed by at least one computer processor to control a recloser on an electrical power line, the plurality of machine-readable instructions comprising instructions to:
gather data before opening the recloser to interrupt a fault on the power line;
determine from the gathered data that the fault has occurred;
open the recloser to interrupt the fault;
analyze the gathered data while the recloser remains open to determine if the fault is a permanent fault; and
determine, before reclosing the recloser, that the recloser should be locked open if the analysis of the gathered data determines that the fault is a permanent fault.

13. The non-transitory computer readable storage medium of claim 12, wherein the instructions to analyze the gathered data to determine if the fault is a permanent fault include instructions to analyze the gathered data to determine if the fault is a momentary fault or is neither a momentary fault nor a permanent fault, and the plurality of machine-readable instructions comprise instructions to determine, before reclosing the recloser, that the recloser can be reclosed if the analysis of the gathered data determines that the fault is a momentary fault or is neither a momentary fault nor a permanent fault.

14. The non-transitory computer readable storage medium of claim 12, comprising instructions to:
reclose the recloser if the analysis of the data determines that the fault is a momentary fault;
reclose the recloser if the analysis of the data determines that the fault is neither a momentary fault nor a permanent fault; and
lock the recloser open if the analysis of the data determines that the fault is a permanent fault.

15. The non transitory computer readable storage medium of claim 14, wherein the recloser is locked open before reclosing into the fault if the analysis of the data before reclosing the recloser determines that the fault is a permanent fault.

16. The non-transitory computer readable storage medium of claim 12, wherein the data gathered before opening the recloser to interrupt the fault is first data, and the machine-readable instructions comprise instructions to:
reclose the recloser if the analysis of the first data does not determine that the fault is a permanent fault;
gather second data after reclosing the recloser; and
analyze at least one of the first and second data to determine whether the fault is a momentary fault or a permanent fault.

17. The non-transitory computer readable storage medium of claim 16, wherein the instructions to analyze at least one of the first and second data to determine whether the fault is a momentary fault or a permanent fault include instructions to compare the second data to the first data.

18. The non-transitory computer readable storage medium of claim 16, comprising instructions to:
determine from the second data that the fault has not been cleared;
re-open the recloser to re-interrupt the fault;
reclose the recloser if analyzing at least one of the first and second data to determine whether the fault is a momentary fault or a permanent fault does not determine that the fault is a permanent fault; and
block further reclosings of the recloser if analyzing at least one of the first and second data to determine whether the fault is a momentary fault or a permanent fault determines that the fault is a permanent fault.

19. A fault interrupting device, comprising:
a switch on an electrical power line; and
a controller configured to operate the switch, wherein the controller comprises at least one processor configured to execute instructions to perform a method, and the instructions comprise instructions to:
gather data regarding the power line before opening the switch to interrupt a fault on at least one phase of the power line;
determine from the gathered data that the fault has occurred;
open the switch to interrupt the fault;
analyze the gathered data while the switch remains open to determine if the fault is a permanent fault; and
determine, before reclosing the switch, that the switch should be locked open if the analysis of the gathered data determines that the fault is a permanent fault.

20. The fault interrupting device of claim 19, wherein the instructions to analyze the gathered data to determine if the fault is a permanent fault include instructions to analyze the gathered data to determine if the fault is a momentary fault or is neither a momentary fault nor a permanent fault, and the instructions comprise instructions to determine, before reclosing the switch, that the switch can be reclosed if the analysis of the gathered data determines that the fault is a momentary fault or is neither a momentary fault nor a permanent fault.

21. The fault interrupting device of claim 19, wherein the instructions comprise instructions to;
   reclose the switch if the analysis of the data determines that the fault is a momentary fault;
   reclose the switch if the analysis of the data determines that the fault is neither a momentary fault nor a permanent fault; and
   lock the switch open if the analysis of the data determines the fault is permanent.

22. The fault interrupting device of claim 21, wherein the instructions comprise instructions to lock the switch open before reclosing into the fault if the analysis of the data before reclosing the switch determines that the fault is permanent.

23. The fault interrupting device of claim 19, wherein the data gathered before opening the switch to interrupt the fault is first data, and the instructions comprise instructions to:
   reclose the switch if the analysis of the first data does not determine that the fault is permanent;
   gather second data after reclosing the switch; and
   analyze at least one of the first and second data to determine whether the fault is a momentary fault or a permanent fault.

24. The fault interrupting device of claim 23, wherein the instructions to analyze at least one of the first and second data to determine whether the fault is a momentary fault or a permanent fault include instructions to compare the second data to the first data.

25. The fault interrupting device of claim 23, wherein the instructions comprise instructions to:
   determine from, the second data that the fault has not been cleared;
   re-open the switch to re-interrupt the fault;
   reclose the switch if analyzing at least one of the first and second data to determine whether the fault is a momentary fault or a permanent fault does not determine that the limit is a permanent fault; and
   block further reclosings of the switch if analyzing at least one of the first and second data to determine whether the fault is a momentary fault or a permanent fault determines that the fault is a permanent fault.

26. The fault interrupting device of claim 19, wherein the data includes information regarding environmental conditions proximate the power line, and the instructions comprise instructions to reclose the switch or lock the switch open independent of whether the fault is a momentary fault or a permanent fault when the environmental conditions are outside predefined limits.

27. The fault interrupting device of claim 19, wherein:
   the at least one processor comprises first and second processors;
   the second processor is remote from the first processor;
   the first processor is configured to execute the instructions to open the switch to interrupt the fault; and
   the second processor is configured to execute the instructions to analyze the gathered data and to determine that the switch should be locked open if the analysis of the gathered data determines that the fault is a permanent fault.

28. The method of claim 2, comprising asserting maloperation of the fault interrupting device if the analysis of the gathered data determines that the fault is neither a momentary fault nor a permanent fault.

* * * * *